(12) United States Patent
Peng et al.

(10) Patent No.: US 12,052,882 B2
(45) Date of Patent: Jul. 30, 2024

(54) DISPLAY PANEL AND DISPLAY DEVICE

(71) Applicant: Kunshan Go-Visionox Opto-Electronics Co., Ltd., Jiangsu (CN)

(72) Inventors: Chao Chi Peng, Jiangsu (CN); Mingxing Liu, Jiangsu (CN); Shuaiyan Gan, Jiangsu (CN)

(73) Assignee: Kunshan Go-Visionox Opto-Electronics Co., Ltd., Kunshan (CN)

( * ) Notice: Subject to any disclaimer, the term of this patent is extended or adjusted under 35 U.S.C. 154(b) by 705 days.

(21) Appl. No.: 17/349,067

(22) Filed: Jun. 16, 2021

(65) Prior Publication Data

US 2021/0313538 A1 Oct. 7, 2021

Related U.S. Application Data

(63) Continuation of application No. PCT/CN2019/130726, filed on Dec. 31, 2019.

(30) Foreign Application Priority Data

May 15, 2019 (CN) .......................... 201920703006.3

(51) Int. Cl.
*H01L 51/50* (2006.01)
*G06F 3/041* (2006.01)
(Continued)

(52) U.S. Cl.
CPC ......... *H10K 50/818* (2023.02); *G06F 3/0412* (2013.01); *H10K 50/171* (2023.02);
(Continued)

(58) Field of Classification Search
CPC ... H10K 50/818; H10K 50/171; H10K 50/828
See application file for complete search history.

(56) References Cited

U.S. PATENT DOCUMENTS

| | | |
|---|---|---|
| 2017/0155085 A1 | 6/2017 | Kwon et al. |
| 2019/0293975 A1 | 9/2019 | Cheng |
| 2019/0393286 A1 | 12/2019 | Ding et al. |

FOREIGN PATENT DOCUMENTS

| | | |
|---|---|---|
| CN | 106876601 A | 6/2017 |
| CN | 107946341 A | 4/2018 |

(Continued)

OTHER PUBLICATIONS

International Search Report and Written Opinion (International Application No. PCT/CN2019/130726) with English Translation, dated Mar. 27, 2020, 12 pages.

*Primary Examiner* — Anthony Ho
(74) *Attorney, Agent, or Firm* — Quarles & Brady LLP

(57) ABSTRACT

A display panel and a display device are disclosed. The display panel includes: a display region including a first display region and a second display region, a light transmittance of the second display region being greater than a light transmittance of the first display region; a substrate located in the first display region and the second display region; an anode layer located on the substrate; a light-emitting layer located on the anode layer; and a cathode layer located on the light-emitting layer; the anode layer includes a reflecting layer, a thickness of the reflecting layer in the second display region is less than the thickness of the reflecting layer in the first display region.

20 Claims, 7 Drawing Sheets

(51) Int. Cl.
*H10K 50/17* (2023.01)
*H10K 50/816* (2023.01)
*H10K 50/818* (2023.01)
*H10K 50/828* (2023.01)
*H10K 50/844* (2023.01)
*H10K 59/122* (2023.01)
*H10K 77/10* (2023.01)
H10K 59/40 (2023.01)
H10K 102/00 (2023.01)
H10K 102/10 (2023.01)

(52) U.S. Cl.
CPC ......... *H10K 50/816* (2023.02); *H10K 50/828* (2023.02); *H10K 50/844* (2023.02); *H10K 59/122* (2023.02); *H10K 77/10* (2023.02); H10K 59/40 (2023.02); H10K 2102/103 (2023.02); H10K 2102/351 (2023.02)

(56) References Cited

FOREIGN PATENT DOCUMENTS

| | | | |
|---|---|---|---|
| CN | 107958186 | A | 4/2018 |
| CN | 108376696 | A | 8/2018 |
| CN | 208076869 | U | 11/2018 |
| CN | 109144320 | A | 1/2019 |
| CN | 208384467 | U | 1/2019 |

DISPLAY PANEL AND DISPLAY DEVICE

CROSS-REFERENCE TO RELATED APPLICATIONS

The present application is a continuation application of the PCT application No. PCT/CN2019/130726, filed on Dec. 31, 2019, which claims priority to Chinese Patent Application No. 201920703006.3, filed on May 15, 2019, and the contents of both applications are herein incorporated by reference in their entireties.

TECHNICAL FIELD

The present disclosure relates to the field of OLED display technology.

BACKGROUND

With the rapid development of active-matrix organic light-emitting diode (AMOLED) display technology, users have increasingly higher requirements for a proportion of a display screen.

SUMMARY

The present disclosure provides a display panel and a display device.

In the first aspect of the present disclosure, a display panel is provided, which includes: a display region including a first display region and a second display region, a light transmittance of the second display region being greater than a light transmittance of the first display region;
  a substrate located in the first display region and the second display region;
  an anode layer located in the first display region and the second display region, the anode layer being located on the substrate, the anode layer including a reflecting layer, a thickness of the reflecting layer located in the second display region being less than the thickness of the reflecting layer located in the first display region;
  a light-emitting layer located in the first display region and the second display region, the light-emitting layer being located on the anode layer; and
  a cathode layer located in the first display region and the second display region, the cathode layer being located on the light-emitting layer.

In the second aspect of the present disclosure, a display device is provided, which includes:
  a device body having a device region;
  the above-mentioned display panel, the display panel covering the device body;
  the device region is located behind the second display region, and the device region includes a photosensitive device which emits or collects light through the second display region.

According to the above embodiments, since the thickness of the reflecting layer in the second display region is less than the thickness of the reflecting layer in the first display region on the display panel, the light transmittance of the second display region is greater than that of the first display region, and the photosensitive device can be provided behind the second display region, which is beneficial to increase the screen-to-body ratio, and enables the photosensitive device located behind the second display region to receive enough light to ensure that the normal work of the photosensitive device.

It should be appreciated that the above general description and the following detailed description are merely exemplary and explanatory, and cannot limit the present disclosure.

DETAILED DESCRIPTION

Since components such as a camera, a sensor, an earpiece, etc., usually need to be mounted in an upper portion of a display screen of a mobile terminal, a part of the upper portion of the display screen is usually reserved for mounting the above components in a notch design scheme adopted in the related art, which affects the overall consistency of the display screen, so that a full-screen display has received more and more attention from the industry.

Exemplary embodiments of the present disclosure will be described in detail below with reference to the accompanying drawings. When the following description refers to the accompanying drawings, unless otherwise indicated, the same numbers in different drawings represent the same or similar elements. The embodiments described in the following exemplary embodiments do not represent all embodiments consistent with the present disclosure. Rather, these embodiments are merely examples of a device and a method consistent with some aspects of the present disclosure as detailed in the appended claims.

An embodiment of the present disclosure provides a display panel. Please referring to FIG. 1, the display panel 1 includes a display region 11. Display region 11 includes a first display region A1 and a second display region A2. Light transmittance of the second display region A2 is greater than that of the first display region A1.

Figure 2A:
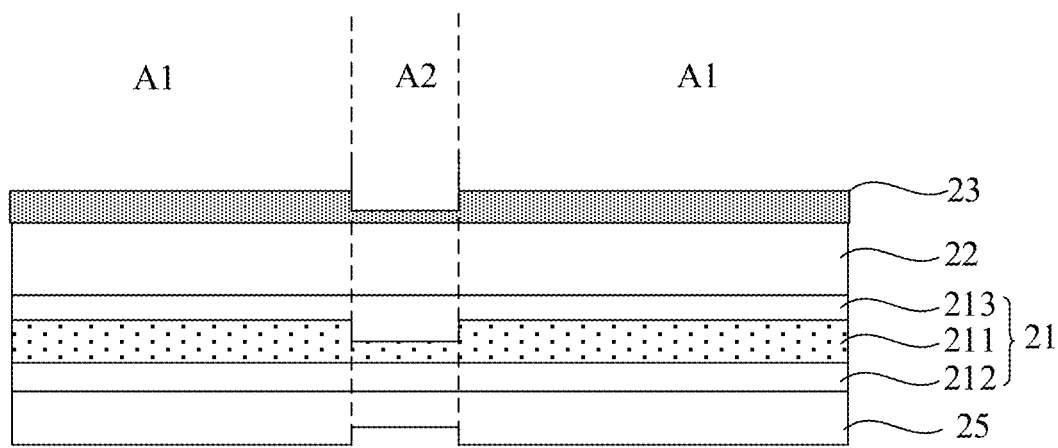
FIG. 2A is a schematic structure diagram of a display panel according to another embodiment of the present disclosure.

Referring to FIG. 2A, the display panel 1 includes a substrate 25, an anode layer 21, a light-emitting layer 22, and a cathode layer 23 which are located in both the first display region A1 and the second display region A2. The anode layer 21 is located on substrate 25, the light-emitting layer 22 is located on the anode layer 21, and the cathode layer 23 is located on the light-emitting layer 22.

Display panel 1 can be an OLED display panel; the light-emitting layer 22 is an organic light-emitting material layer.

The anode layer 21 includes a reflecting layer 211. A thickness of the reflecting layer 211 in the second display region A2 is less than that of the reflecting layer 211 in the first display region A1. In other words, the reflecting layer 211 can include a first region and a second region; the first region is located in the first display region, the second region is located in the second display region; and the thickness of the second region is less than that of the first region.

The thickness of the reflecting layer located in the second display region is less than that of the reflecting layer located in the first display region on the display panel in the embodiment of the present disclosure, such that the light transmittance of the second display region is greater than that of the first display region, thereby the photosensitive device can be arranged behind the second display region, which is beneficial to increase the screen-to-body ratio, and the photosensitive device located behind the second display region can receive sufficient light to ensure normal work thereof.

In an embodiment, the material of the reflecting layer 211 can be metal. Since the reflectivity of metal is higher, the reflecting property of the reflecting layer can be improved.

Preferably, the material of the reflecting layer 211 can be silver. Since the silver can implement a transflective function to light, the reflecting layer in the second display region can not only meet the requirement of light transmission but also meet the requirement of light reflection. The transflective function here means that the light is partially transmitted and partially reflected.

Preferably, the transflective function can be that the light transmittance and reflectance of light are both 50%.

When the material of the reflecting layer 211 is silver, the thickness of the reflecting layer 211 in the first display region A1 can be in a range of 600 ANG to 1200 ANG; and the thickness of the reflecting layer 211 in the second display region A2 can be in a range of 20 ANG to 100 ANG.

In an embodiment, as shown in FIG. 2A, the anode layer 21 further includes a first transparent conducting layer 212 and a second transparent conducting layer 213. The reflecting layer 211 can be located between the first transparent conducting layer 212 and the second transparent conducting layer 213. In such a way, the anode layer can achieve a conductive function, a light transmission function, and a light reflection function.

The material of the first transparent conducting layer 212 is indium tin oxide (ITO) or indium zinc oxide. Preferably, the material of the first transparent conducting layer 212 is indium tin oxide (ITO). The anode layer can achieve both a conductive function and a light transmission function.

The material of the second transparent conducting layer is indium tin oxide or indium zinc oxide. Preferably, the material of the second transparent conducting layer is indium tin oxide. The anode layer can achieve both a conductive function and a light transmission function.

When the material of the reflecting layer 211 is silver, the reflecting layer 211 can be manufactured by the following two methods.

Method one: firstly, a first layer of silver film is manufactured in the first display region A1 and the second display region A2. The thickness of the first layer of silver film is the thickness of the reflecting layer 211 in the second display region A2; then, a second layer of silver film is manufactured on the first layer of silver film in the first display region A1; a sum of the thickness of the first layer of silver film and the thickness of the second layer of silver film is equal to the thickness of the reflecting layer 211 in the first display region A1.

Method two: firstly, a third layer of silver film is manufactured in the first display region A1 and the second display region A2, the thickness of the third layer of silver film is equal to the thickness of the reflecting layer 211 in the first display region A1; then, the third layer of silver film in the second display region A2 is etched until the thickness of the third layer of silver film in the second display region A2 is equal to the thickness of the reflecting layer 211 in the second display region A2.

It should be emphasized that when the first transparent conducting layer 212 is located under the reflecting layer 211, the second transparent conducting layer 213 is located over the reflecting layer 211, and the material of the second transparent conducting layer 213 is indium tin oxide (ITO); when the second transparent conducting layer 213 is manufactured by sputtering or evaporation, if the reflecting layer 211 is continuous at a junction of the first display region A1 and the second display region A2, an upper surface of the manufactured second transparent conducting layer 213 has a certain slope at the junction, that is, an upper surface of the anode layer 21 has a certain slope at the junction and is not flat, accordingly it is difficult to manufacture pixels at the junction. In the aforementioned embodiment where no pixels are manufactured at the junction, the reflecting layer 211 can be continuous at the junction of the first display region A1 and the second display region A2.

Preferably, the first display region A1 and the second display region A2 are AMOLED display regions. Specifically, driving modes of the first display region A1 and the second display region A2 can both be active driving. In this embodiment, the anode layer 21 in the first display region A1 can include block anodes arranged in an array; and the anode layer 21 in the second display region A2 also includes block anodes arranged in an array. Therefore, in this embodiment, referring to FIG. 2C, the reflecting layer 211 can be discontinuous at the junction of the first display region A1 and the second display region A2. Further, the anode layer 21 can be discontinuous at the above-mentioned junction of the first display region A1 and the second display region A2. Specifically, at the aforementioned junction, a pixel definition layer (PDL) 28 can fill between the anode layer 21 in the first display region A1 and the anode layer 21 in the second display region A2. A pixel definition layer (PDL) 28 can also fill between adjacent block anodes in the first display region A1; and a pixel definition layer (PDL) 28 can also fill between adjacent block anodes in the second display region A2. In addition, the upper surface of the anode layer 21 in the second display region A2 is not on the same level as the upper surface of the anode layer 2 in the first display region A1.

As shown in FIG. 2A, the thickness of the cathode layer 23 in the second display region A2 is less than that of the cathode layer 23 in the first display region A1. In other words, the cathode layer 23 can include a third region and a fourth region; the third region is located in the first display region, the fourth region is located in the second display region; and the thickness of the fourth region is less than that of the third region. The thickness of the cathode layer in the second display region is less than that of the cathode layer in the first display region, such that the light transmittance of the second display region is further greater than the light transmittance of the first display region.

In an embodiment, as shown in FIG. 2A, the thickness of the reflecting layer 211 in the second display region A2 can be greater than that of the cathode layer 23 in the second display region A2. In another embodiment, the thickness of the reflecting layer 211 in the second display region A2 can also be equal to the thickness of the cathode layer 23 in the second display region A2. In such a way, it can be ensured that the reflecting layer can reflect the light emitted by the light-emitting layer back, thereby further ensuring the light-emitting brightness of the second display region.

The material of the cathode layer 23 can be a magnesium-silver alloy. Due to the strong conductive ability of the silver and the silver can implement the transflective function to the light, and then the magnesium-silver alloy can make coherence enhancement of the light in the exit direction and the light reflected back by the cathode layer, thereby improving the efficiency of the light-emitting. The material of the cathode layer 23 is not limited to the magnesium-silver alloy.

A mass ratio of the magnesium to the silver in the cathode layer can range from 1:20 to 1:4. Increasing the proportion of silver in the cathode layer can enhance the conductivity of the cathode layer and improve the efficiency of light-emitting.

The thickness of the cathode layer 23 in the first display region A1 can range from 80 ANG to 150 ANG; and the thickness of the cathode layer 23 in the second display region A2 can range from 20 ANG to 60 ANG.

Figure 2B:
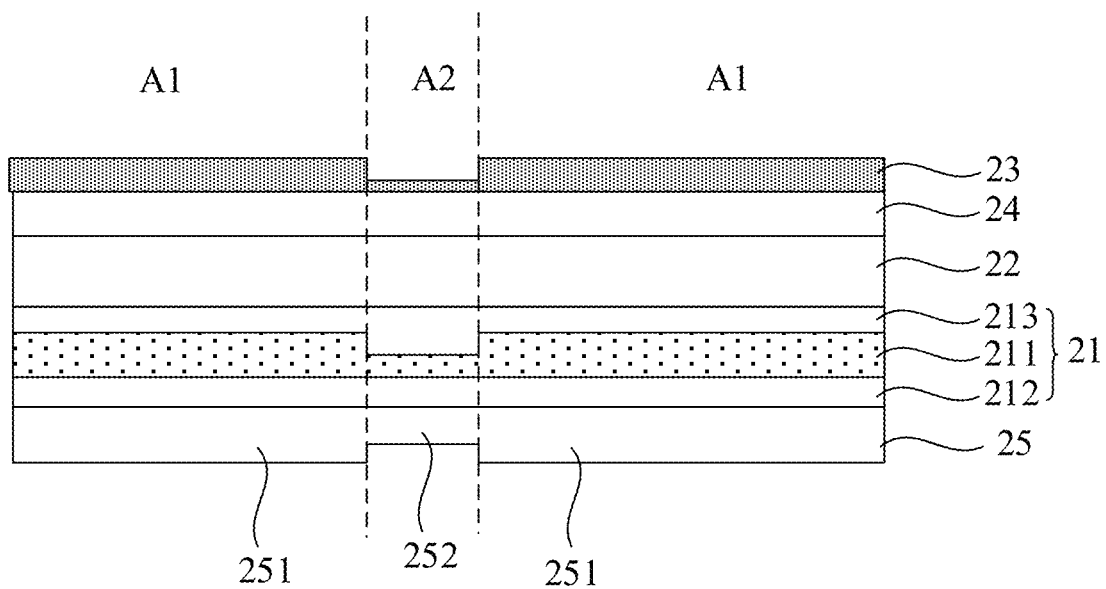
FIG. 2B is a schematic structure diagram of a display panel according to another embodiment of the present disclosure.

Referring to FIG. 2B, the display panel 1 can further include an electron injection layer 24. The electron injection layer 24 can be located between the cathode layer 23 and the light-emitting layer 22. The electron injection layer can improve the injection capability of carriers.

The material of the electron injection layer 24 can include silver and at least one of magnesium, potassium, lithium, or cesium. Since magnesium, potassium, lithium, and cesium are respectively active metals with low work functions, which facilitates electron transmission.

Preferably, the material of the electron injection layer is the magnesium-silver alloy. The mass ratio of the magnesium to the silver in the electron injection layer can range from 4:1 to 20:1. Increasing the content of the magnesium in the electron injection layer can increase the injection capability of the carriers.

The display panel 1 can further include an encapsulation layer (not shown), and the encapsulation layer can be located on the cathode layer 23. In such a way, the light-emitting device can be protected.

Figure 2C:
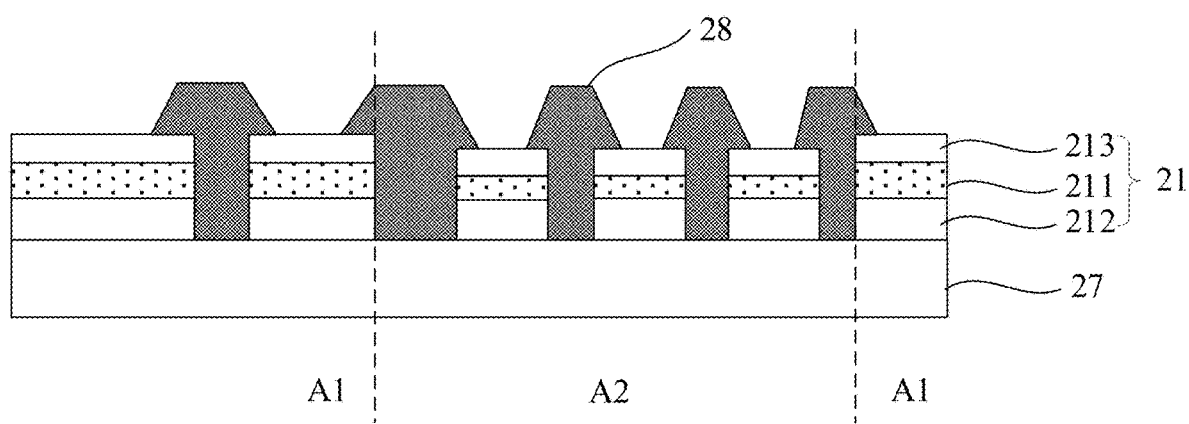
FIG. 2C is a schematic structure diagram of a display panel according to another embodiment of the present disclosure.
Figure 2D:
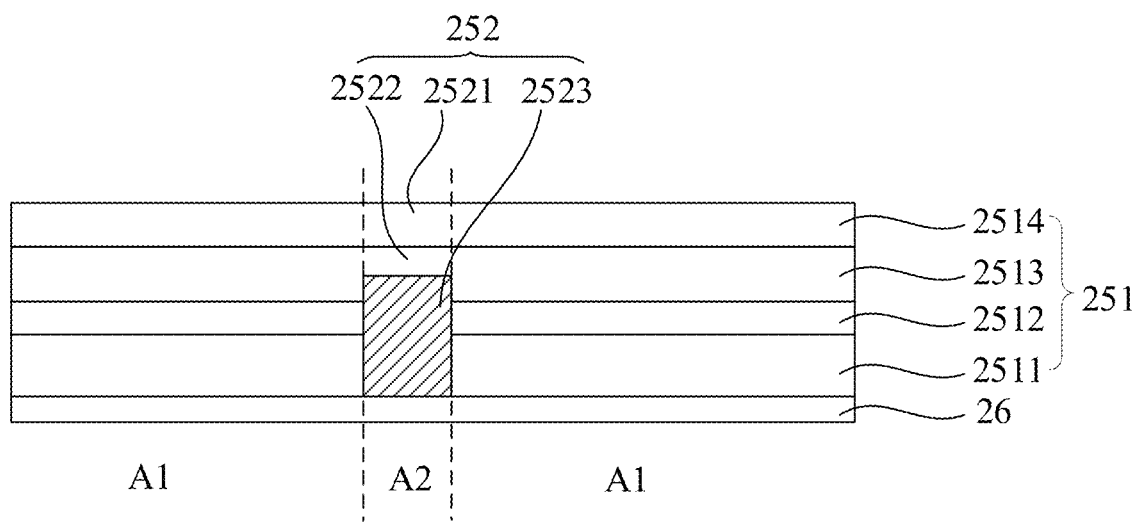
FIG. 2D is a schematic structure diagram of a display panel according to another embodiment of the present disclosure.

Referring to FIG. 2B and FIG. 2D. Substrate 25 can include a first substrate 251 and a second substrate 252. The first substrate 251 is located in the first display region A1, and the second substrate 252 is located in the second display region A2. The light transmittance of the second substrate 252 is greater than that of the first substrate 251. Since the light transmittance of the second substrate is greater than that of the first substrate, the light transmittance of the second display region can be further improved.

Preferably, as shown in FIG. 2A, the thickness of the second substrate 252 is less than that of the first substrate 251. Since the thickness of the second substrate is less than the thickness of the first substrate, the light transmittance of the second display region can be further improved.

Preferably, at least a part of the second substrate 252 in the thickness direction is integrated with the first substrate 251. In such a way, the manufacturing process can be saved.

As shown in FIG. 2D, the second substrate 252 includes a first organic layer 2522, a first inorganic layer 2521 located on the first organic layer 2522, and a transparent layer 2523 located under the first organic layer 2522. The first substrate 251 includes a second organic layer 2511, a second inorganic layer 2512, a third organic layer 2513, and a third inorganic layer 2514 which are sequentially overlapped from bottom to top. The first organic layer 2522 is integrated with the third organic layer 2513. The first inorganic layer 2521 is integrated with the third inorganic layer 2514. The thickness of the first organic layer 2522 is less than the thickness of the third organic layer 2513, and the thickness of the first inorganic layer 2521 is equal to the thickness of the third inorganic layer 2514.

The material of the transparent layer 2523 can be a material with high light transmittance. For example, the light transmittance of the transparent layer 2523 can be greater than 90%. In an embodiment, the material of the transparent layer 2523 can include at least one of polyethylene terephthalate (PET) and polycarbonate (PC). The light transmittance of PET and PC can both be 92%.

Preferably, as shown in FIG. 2D, a protective layer 26 is further provided under the first substrate 25 and the second substrate 252. The protective layer 26 can protect the first substrate 251 and the second substrate 252, to improve the mechanical strength of the display panel, and then to increase the service life of the display panel.

Preferably, the light transmittance of the second substrate is greater than 50%. The light transmittance of the first substrate is in a range of 30% to 60%.

As shown in FIG. 2C, the display panel further includes a driving circuit layer 27; and the driving circuit layer 27 is located between the substrate 25 and the anode layer 21.

The driving circuit layer 27 located in the first display region A1 includes a plurality of first driving circuit units. The first driving circuit unit includes a transistor and a storage capacitor. The driving circuit layer 27 located in the second display region A2 includes a plurality of second driving circuit units. The second driving circuit unit includes a storage capacitor and a transistor. The number of transistors of the second driving circuit unit is less than the number of transistors of the first driving circuit unit. In such a way, it can be beneficial to increase the light transmittance of the second display region.

Figure 3:
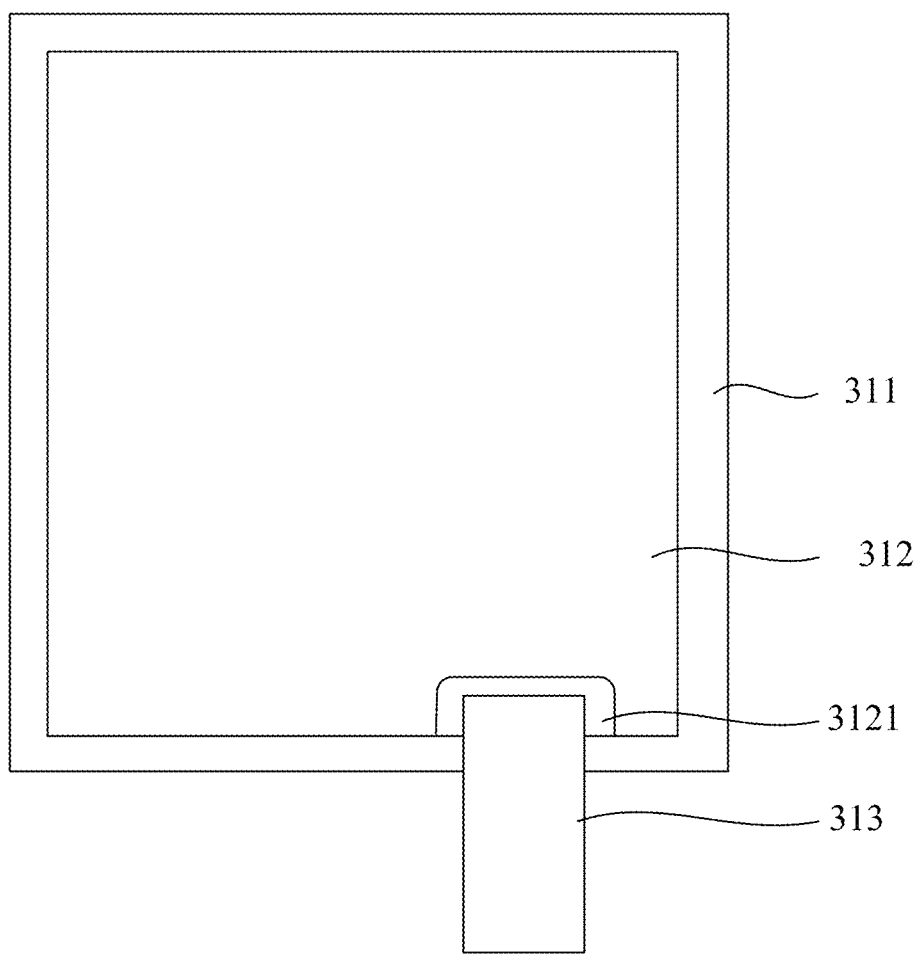
FIG. 3 is a schematic structure diagram of a display panel according to another embodiment of the present disclosure.
Figure 4:
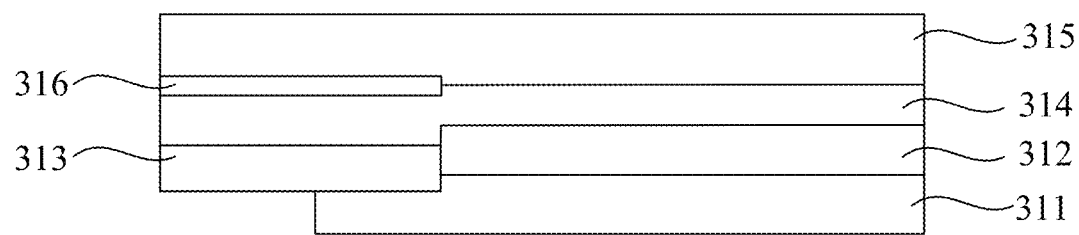
FIG. 4 is a schematic structure diagram of a display panel according to another embodiment of the present disclosure.

Please referring to FIG. 2A, FIG. 3, and FIG. 4, the display panel 1 can further include a non-display region 12 surrounding the display region 11. The encapsulation layer (not shown) can include a touch control layer 311, a polarizer 312, a flexible circuit board 313, a first bonding layer 314, and a glass cover plate 315. The touch control layer 311 is located on the cathode layer 23. The polarizer 312 is located on the touch control layer 311. A lower edge of the polarizer 312 is provided with a notch 3121. Specifically, the lower edge of the polarizer 312 is recessed inward to form the notch 3121. The notch 3121 is located in the non-display region 12. The flexible circuit board 313 is located on the touch control layer 311. One part of the flexible circuit 313 is located in the notch 3121, and the other part is located outside the notch 3121. In other words, one end of the flexible circuit board 313 is located in the notch 3121 and extends from the bottom of the notch 3121 to the outside of the notch 3121. The flexible circuit board 313 is electrically connected to the touch control layer 311. The first bonding layer 314 is located on the flexible circuit board 313 and the polarizer 312. The glass cover plate 315 is located on the first bonding layer 314.

In such a way, by providing the notch on the lower edge of the polarizer, arranging the flexible circuit board of the touch control layer in the notch, and then covering the flexible circuit board and the polarizer with the bonding layer, the segment difference during bonding can be reduced and generation of bubbles can be avoided; in addition, warping of the polarizer caused by the overlapping of the polarizer and the touch control layer can be avoided, and the phenomenon that a contact surface is convex when the polarizer is bonded to the touch control layer is avoided.

Figure 1:
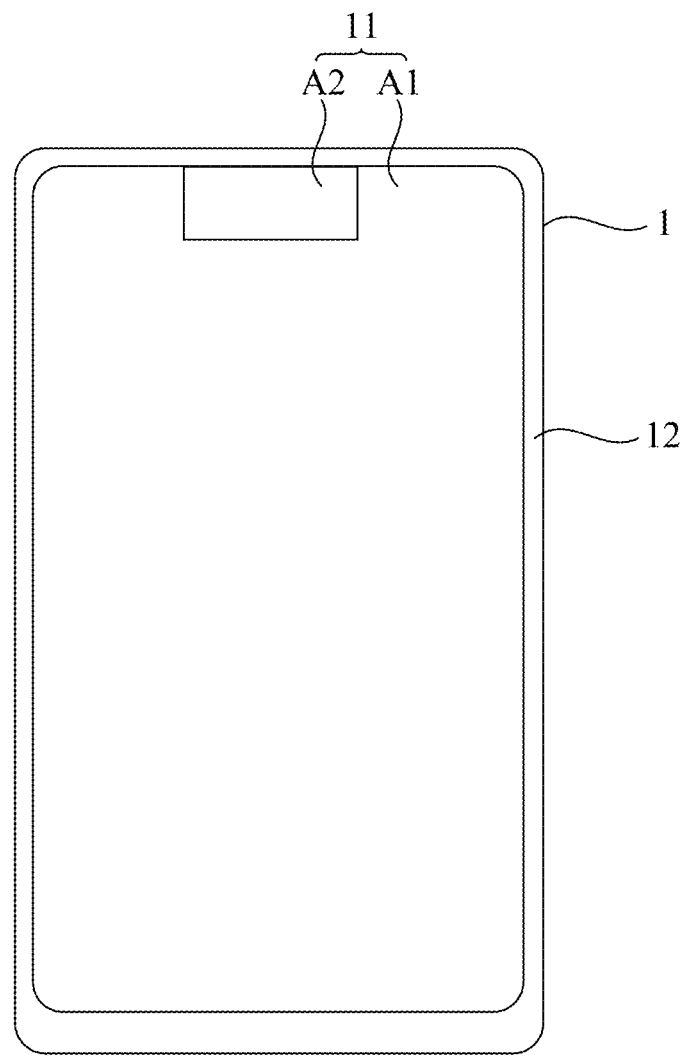
FIG. 1 is a schematic structure diagram of a display panel according to an embodiment of the present disclosure.

It should be noted that in the embodiment of the present disclosure, the direction of the top end of the display panel is up, and the direction of the bottom end is down. A second display region A2 can be provided at a position in the display region 11 of the display panel 1 near the top end, as shown in FIG. 1.

As shown in FIG. 4, the encapsulation layer can further include an ink layer 316. The ink layer 316 is located on the first bonding layer 314 in the non-display region 12, and is opposite to the flexible circuit board 313. An upper surface of the ink layer 316 is flush with an upper surface of the first bonding layer 314 in the display region 11. In such a way, the first bonding layer at the notch and the flexible circuit board can be pressed together by increasing the thickness of the ink layer, to fully fill the segment difference, thereby avoiding the generation of bubbles during the full bonding process.

Specifically, as shown in FIG. 4, a distance between a lower surface of the flexible circuit board 313 and the upper surface of the ink layer 316 is a first distance; a distance between a lower surface of the polarizer 312 in the display region 11 and the upper surface of the first bonding layer 314 is a second distance; and the first distance is equal to the second distance.

Display panel 1 can further include a second bonding layer (not shown), and the second bonding layer is located between the touch control layer 311 and the polarizer 312.

The material of the first bonding layer can be optical transparent adhesive.

The material of the second bonding layer can also be optical transparent adhesive.

The embodiment of the disclosure further provides a display device. The display device includes a device body and the display panel described in any of the above embodiments. The display panel covers the device body.

The device body has a device region. The device region is located behind the second display region, and the device region includes a photosensitive device which emits or collects light through the second display region.

The photosensitive device includes at least one of a camera, a light sensor, and a light emitter.

Advantages of the embodiments are provided as follows: since the thickness of the reflecting layer located in the second display region is less than the thickness of the reflecting layer located in the first display region on the display panel, the light transmittance of the second display region is greater than that of the first display region, accordingly, the photosensitive device can be arranged behind the second display region, which is beneficial to increase the screen-to-body ratio and enables the photosensitive device located behind the second display region to receive enough light to ensure normal work of the photosensitive device.

It should be noted that the display device in this embodiment can be any product or component with a display function, such as an electronic paper, a mobile phone, a tablet computer, a television, a laptop, a digital photo frame, a navigation equipment, etc.

It should be understood that the present disclosure is not limited to the precise structure described above and shown in the drawings, and various modifications and variations can be made without departing from the scope thereof. The scope of the present disclosure is only limited by the appended claims.

What is claimed is:

1. A display panel, comprising:
    a display region, comprising a first display region and a second display region, a light transmittance of the second display region being greater than a light transmittance of the first display region;
    a substrate, located in the first display region and the second display region;
    an anode layer, located on the substrate of the first display region and the second display region, the anode layer comprising a reflecting layer, a thickness of the reflecting layer located in the second display region being less than the thickness of the reflecting layer located in the first display region;
    a light-emitting layer, located on the anode layer of the first display region and the second display region; and
    a cathode layer, located in the first display region and the second display region, the cathode layer being located on the light-emitting layer.

2. The display panel according to claim 1, wherein a material of the reflecting layer is metal.

3. The display panel according to claim 2, wherein the material of the reflecting layer is silver.

4. The display panel according to claim 2, wherein the thickness of the reflecting layer in the first display region is in a range of 600 ANG to 1200 ANG, and the thickness of the reflecting layer in the second display region is in a range of 20 ANG to 100 ANG.

5. The display panel according to claim 1, wherein the anode layer further comprises a first transparent conducting layer and a second transparent conducting layer; and wherein the reflecting layer is located between the first transparent conducting layer and the second transparent conducting layer.

6. The display panel according to claim 5, wherein a material of the first transparent conducting layer is indium tin oxide or indium zinc oxide and a material of the second transparent conducting layer is indium tin oxide or indium zinc oxide.

7. The display panel according to claim 5, wherein the reflecting layer located in the first display region is disposed uncontinuously with the second display region at a junction therebetween and the anode layer located in the first display region is disposed uncontinuously with the second display region at a junction therebetween.

8. The display panel according to claim 7, wherein a pixel definition layer is provided between the anode layer located in the second display region and the anode layer located in the first display region.

9. The display panel according to claim 1, wherein a thickness of the cathode layer located in the second display region is less than the thickness of the cathode layer located in the first display region.

10. The display panel according to claim 9, wherein the thickness of the reflecting layer located in the second display region is greater than or equal to the thickness of the cathode layer located in the second display region.

11. The display panel according to claim 10, wherein:
    a material of the cathode layer is a magnesium-silver alloy, a mass ratio of the magnesium to the silver in the cathode layer is in a range of 1:20 to 1:4; and
    a thickness of the cathode layer in the first display region is in a range of 80 ANG to 150 ANG, and the thickness of the cathode layer in the second display region is in a range of 20 ANG to 60 ANG.

12. The display panel according to claim 1, further comprising:
    an electron injection layer located between the cathode layer and the light-emitting layer; and
    a material of the electron injection layer comprising silver and at least one of magnesium, potassium, lithium, or cesium.

13. The display panel according to claim 12, wherein the material of the electron injection layer is a magnesium-silver alloy, a mass ratio of the magnesium to the silver in the electron injection layer is in a range of 4:1 to 20:1.

14. The display panel according to claim 1, further comprising an encapsulation layer located on the cathode layer; wherein the substrate comprises a first substrate and a second substrate, the first substrate is located in the first display region, the second substrate is located in the second display region, and a light transmittance of the second substrate is greater than a light transmittance of the first substrate.

15. The display panel according to claim 14, wherein:
a thickness of the second substrate is less than a thickness of the first substrate;
the second substrate comprises a first organic layer and a first inorganic layer located on the first organic layer;
the first substrate comprises a second organic layer, a second inorganic layer, a third organic layer, and a third inorganic layer which are sequentially overlapped from bottom to top;
the first organic layer is integrated with the third organic layer;
the first inorganic layer is integrated with the third inorganic layer;
a thickness of the first organic layer is less than a thickness of the third organic layer, and a thickness of the first inorganic layer is equal to a thickness of the third inorganic layer.

16. The display panel according to claim 14, wherein:
the light transmittance of the second substrate is greater than 50%;
the light transmittance of the first substrate is in a range of 30% to 60%; and
the first display region and the second display region are active matrix organic light-emitting diode display regions.

17. The display panel according to claim 1, further comprising a driving circuit layer located between the substrate and the anode layer;
wherein the driving circuit layer located in the first display region comprises a plurality of first driving circuit units, each first driving circuit unit comprises a plurality of transistors and a plurality of storage capacitors, the driving circuit layer located in the second display region comprises a plurality of second driving circuit units, each second driving circuit unit comprises a plurality of storage capacitors and a plurality of transistors, and a number of the transistors in the second driving circuit unit is less than a number of the transistors in the first driving circuit unit.

18. The display panel according to claim 1, further comprising a non-display region surrounding the display region, wherein the encapsulation layer comprises a touch control layer, a polarizer, a flexible circuit board, a first bonding layer and a glass cover plate;
wherein the touch control layer is located on the cathode layer, the polarizer is located on the touch control layer, a lower edge of the polarizer is provided with a notch located in the non-display region;
wherein the flexible circuit board is located on the touch control layer, one part of the flexible circuit board is located in the notch, and the other part is located outside the notch;
wherein the first bonding layer is located on the flexible circuit board and the polarizer; and the glass cover plate is located on the first bonding layer.

19. The display panel according to claim 18, wherein the encapsulation layer further comprises an ink layer which is located on the first bonding layer in the non-display region and is positioned opposite to the flexible circuit board; and an upper surface of the ink layer is flush with an upper surface of the first bonding layer in the display region;
wherein a distance between a lower surface of the flexible circuit board and the upper surface of the ink layer is defined as a first distance, a distance between a lower surface of the polarizer in the display region and the upper surface of the first bonding layer is defined as a second distance, and the first distance is equal to the second distance;
wherein the display panel further comprises a second bonding layer located between the touch control layer and the polarizer;
wherein a material of the first bonding layer is optical transparent adhesive, and/or a material of the second bonding layer is optical transparent adhesive.

20. A display device, comprising:
a device body having a device region; and
a display panel comprising:
a display region, comprising a first display region and a second display region, a light transmittance of the second display region being greater than a light transmittance of the first display region;
a substrate, located in the first display region and the second display region;
an anode layer, located on the substrate of the first display region and the second display region, the anode layer comprising a reflecting layer, a thickness of the reflecting layer located in the second display region being less than the thickness of the reflecting layer located in the first display region;
a light-emitting layer, located on the anode layer of the first display region and the second display region; and
a cathode layer, located in the first display region and the second display region, the cathode layer being located on the light-emitting layer;
wherein the display panel covers the device body; and
wherein the device region is located behind the second display region, and the device region comprises a photosensitive device which emits or collects light through the second display region.

* * * * *